(12) United States Patent
Pan et al.

(10) Patent No.: US 12,253,776 B2
(45) Date of Patent: Mar. 18, 2025

(54) METHOD OF FORMING ELECTRONIC DEVICE

(71) Applicant: InnoLux Corporation, Miao-Li County (TW)

(72) Inventors: Tai-Chi Pan, Miao-Li County (TW); Chin-Lung Ting, Miao-Li County (TW); I-Chang Liang, Miao-Li County (TW); Chih-Chiang Chang Chien, Miao-Li County (TW); Po-Wen Lin, Miao-Li County (TW); Kuang-Ming Fan, Miao-Li County (TW); Sheng-Nan Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/615,105

(22) Filed: Mar. 25, 2024

(65) Prior Publication Data

US 2024/0264501 A1    Aug. 8, 2024

Related U.S. Application Data

(63) Continuation of application No. 18/319,622, filed on May 18, 2023, now Pat. No. 11,966,133, which is a (Continued)

(30) Foreign Application Priority Data

Jun. 11, 2021  (CN) .......................... 202110656860.0

(51) Int. Cl.
G02F 1/1362      (2006.01)
G02F 1/13        (2006.01)
(Continued)

(52) U.S. Cl.
CPC .. *G02F 1/136259* (2013.01); *G02F 1/133504* (2013.01); *G02F 1/133516* (2013.01);
(Continued)

(58) Field of Classification Search
None
See application file for complete search history.

(56) References Cited

U.S. PATENT DOCUMENTS 10,007,131 B2   6/2018  Bae
11,003,033 B2   5/2021  Cheng
(Continued)

FOREIGN PATENT DOCUMENTS

CN    106200035 A    12/2016
CN    109696756 A     4/2019
JP    2005148168 A  *  6/2005

OTHER PUBLICATIONS

Chinese language office action dated Nov. 22, 2024, issued in application No. CN 202110656860.0.

*Primary Examiner* — Phu Vu

(74) *Attorney, Agent, or Firm* — McClure, Qualey & Rodack, LLP

(57) ABSTRACT

A method of forming an electronic device including: providing an assembly, wherein the assembly includes a substrate, an optical film, a plurality of color filters and a defect, wherein the plurality of color filters and the defect are disposed between the substrate and the optical film; and using a laser pulse to form a first processed area that corresponds to the defect in the optical film, wherein the first processed area at least partially overlaps at least two of the plurality of color filters.

16 Claims, 11 Drawing Sheets

Related U.S. Application Data continuation of application No. 17/477,862, filed on Sep. 17, 2021, now Pat. No. 11,693,285.

(51) Int. Cl.
*G02F 1/1335* (2006.01)
*G02F 1/1337* (2006.01)

(52) U.S. Cl.
CPC .. G02F 1/133562 (2021.01); G02F 1/133788 (2013.01); *G02F 1/133528* (2013.01)

(56) References Cited

U.S. PATENT DOCUMENTS

| | | | |
|---|---|---|---|
| 2010/0253877 A1* | 10/2010 | Lee | G02F 1/1309 445/61 |
| 2016/0349549 A1* | 12/2016 | Bae | G02F 1/133305 |
| 2020/0150500 A1* | 5/2020 | Cheng | G02F 1/13439 |

* cited by examiner

METHOD OF FORMING ELECTRONIC DEVICE

CROSS REFERENCE TO RELATED APPLICATIONS

This Application is a Continuation of U.S. application Ser. No. 18/319,622, filed on May 18, 2023, now U.S. Pat. No. 11,966,133, which is a Continuation of U.S. application Ser. No. 17/477,862, filed on Sep. 17, 2021, now U.S. Pat. No. 11,693,285, and claims priority of China Patent Application No. 202110656860.0, filed on Jun. 11, 2021, the entirety of which is incorporated by reference herein.

BACKGROUND OF THE INVENTION

Field of the Invention

The present disclosure relates to a method of forming an electronic device, and in particular to a method of forming an electronic device comprising an optical film.

Description of the Related Art

Electronic devices like display devices are widely used in electronic devices such as mobile phones, TVs, monitors, tablet PCs, vehicle electronic devices, wearable devices and desktop computers. With the booming development of electronic products, the requirement for a display quality of an electronic device is getting higher and higher.

However, when foreign matter falls onto the electronic devices, for example, foreign matter may fall onto an active array substrate or a color filter substrate, or attaches itself to one of the layers between the color filter substrate and the active array substrate during the manufacturing process, this may cause defects in the electronic device. These defects often result in bright spots or dark spots on the electronic device. Therefore, the overall quality of the electronic device will be affected.

Therefore, providing a method of forming an electronic device that will improve the display quality without increasing the cost is still an issue that needs to be worked on.

BRIEF SUMMARY OF THE INVENTION

The present disclosure provides an electronic device comprising an optical film and a method of forming the same, which can improve the display quality of the electronic device.

Some embodiments of the present disclosure provide a method of forming an electronic device including: providing an assembly, wherein the assembly comprises a substrate, an optical film, a plurality of color filters and a defect, wherein the plurality of color filters and the defect are disposed between the substrate and the optical film; and using a laser pulse to form a first processed area that corresponds to the defect in the optical film, wherein the first processed area at least partially overlaps at least two of the plurality of color filters.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

Figure 1:
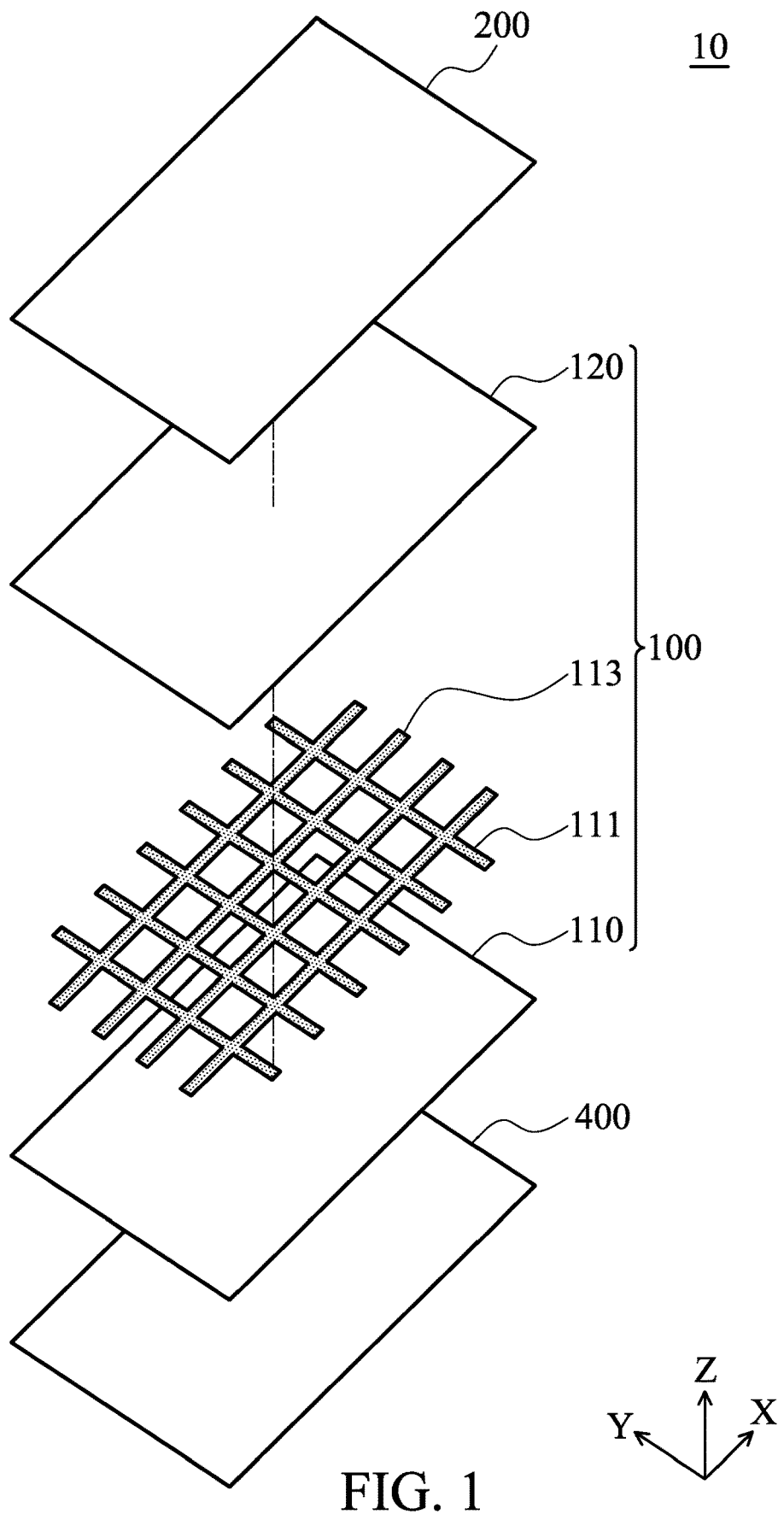
FIG. 1 illustrates an exploded view of an example of an electronic device of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Some embodiments of the disclosure are described. Additional operations can be provided before, during, and/or after the stages described in these embodiments. Some of the stages that are described can be replaced or eliminated for different embodiments. Although some embodiments are discussed with operations performed in a particular order, these operations may be performed in another logical order.

Furthermore, when a component or a layer is referred to as "on" or "connected to" another component or film, the component or layer may be directly on or directly connected to the other component or film, or there may be an interval component or film disposed between them. Conversely, when a component is referred to as being "directly" on another component or film or "directly connected" to another component or film, there is no interval component or film disposed between them.

The term "about" or "substantially" as used herein indicates that a value or a range of numbers is described within 10%, 5%, 3%, 2%, 1%, or 0.5% of the value. The value of the given quantity are approximate quantities, i.e. "about" or "substantially" may be implied without specifying "about" or "substantially". The term "range between the first and second values" indicates a range including the first value, the second value and other values between them.

The electronic device of the present disclosure may include a display device, an antenna device, a sensing device, a touch display electronic device, a curved display electronic device, or a free shape display electronic device, but the present disclosure is not limited there to. The electronic device maybe a bendable or flexible electronic device. The antenna device maybe, for example, a liquid crystal antenna, but not limited there to. The antenna device may, for example, include an antenna splicing device, but is not limited thereto. It should be noted that the electronic device can be but not limited to any combination of the aforementioned. In addition, a shape of the electronic device may be a rectangle, a circle, a polygon, a shape with curved edges, or other suitable shape. The electronic device may have peripheral systems, such as a drive system, control system, light source system, shelf system and the likes for supporting the electronic device, antenna device or the splicing device. Hereinafter, a display device will be used as an example to illustrate the contents of this disclosure, but this disclosure is not limited thereto.

FIG. 1 illustrates an exploded view of an example of an electronic device 10 of the present disclosure. As shown in the FIG. 1, the electronic device 10 comprises a panel 100 and a first optical film 200 disposed on the panel 100. The panel 100 comprises a first substrate 110, scan lines 113 extending in a first direction (X direction), data lines 111 extending in a second direction (Y direction), and a second substrate 120 corresponding to the first substrate 110 disposed on the scan lines 113 and the data lines 111. The first direction is perpendicular to the second direction. The first substrate 110 may be, for example, a thin film transistor array substrate, and the second substrate 120 may be, for example, a color filter substrate. According to some embodiments, the second substrate may be, for example, a polymer substrate, but not limited thereto. Materials of the first substrate 110 and the second substrate 120 may be the same or different. The materials may include but not limited to glass, quartz, sapphire, ceramic, polyimide (PI), polycarbonate (PC), polyethylene terephthalate (PET), polypropylene (PP), other suitable materials or any combination thereof.

A plurality of display units are provided on the first substrate 110. In the present disclosure, the display units of the electronic device are sub-pixels or pixels which display images to viewers. Each of the display units has a stacked structure comprising all film layers, elements or parts for emitting light with brightness and color. For a liquid crystal display, the display units are sub-pixels, and each display unit may include relevant parts of a liquid crystal layer, relevant parts of a polarizer, relevant parts of a back light source, relevant parts of a substrate, relevant parts of a driver circuit, and relevant parts of a color filter. For self-light emitting displays, such as inorganic light-emitting diode displays (LEDs) and organic light-emitting diode displays (OLEDs), the display units are sub-pixels or pixels. Each display unit may include relevant parts of a self-emitting light source, relevant parts of light conversion layer, relevant parts of a polarizer, relevant parts of a substrate, and relevant parts of a driver circuit. In addition, the plurality of display units may have a common film layer, a common component, or a common part. Hereinafter, a liquid crystal display will be used as an example to illustrate the present disclosure.

Figure 2:
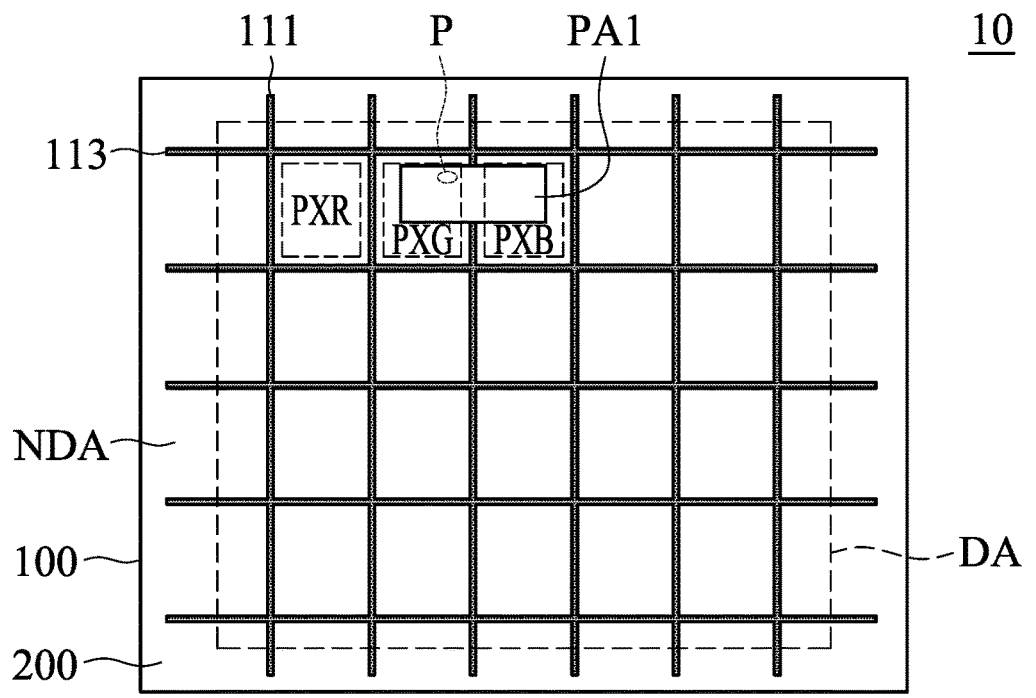
FIG. 2 illustrates a top view of an example of an electronic device of the present disclosure.

The data lines 111 are disposed on the first substrate 110 in the first direction and the scanning lines 113 are disposed on the first substrate 110 in the second direction. The scanning lines 113 and the data lines 111 are intersected with each other to define a plurality of display units PX on the first substrate 110, as shown in FIG. 2. Some components such as a cover plate (cover glass) or a backlight module are omitted from the electronic device 10 for the convenience of description. The cover plate may be, for example, a glass or an acrylic resin, but it is not limited thereto. The cover plate may or may not have a touch function. The backlight module may for example, include relevant optical films (such as light panels, light bars, light guide plates, reflectors, and brightness enhancement films). The backlight module may be, for example, a direct-type light module or a side-type light module, but not limited thereto.

FIG. 2 illustrates a top view of an example of the electronic device 10 of the present disclosure. As shown in FIG. 2, the panel 100 includes a display area DA and a non-display area NDA surrounding the display area DA. The display units PX defined by the scan lines 113 and the data lines 111 are located in the display area DA. The display unit PX includes at least one thin film transistor (TFT). According to the color of the emitted light, the display units PX may have the same or similar features. The display units PX can be divided into red display units PXR, green display units PXG, and blue display units PXB. It should be understood that, unless otherwise indicated, the features described below for a specific display unit PX of the electronic device 10 can also be applied to any other display units PX of the electronic device 10. For example, the features described below for the green display unit PXG can be applied to the red display unit PXR and/or the blue display unit PXB. In addition, it should be understood that according to design requirements, the electronic device 10 may have any appropriate number of display units PX. In some embodiments, the red display units PXR, the green display units PXG, and the blue display units PXB may be arranged alternately with each other. For example, the red display units PXR, the green display units PXG, and the blue display units PXB may be arranged alternately in the first direction, as shown in FIG. 2. In another embodiment, the red display units PXR, the green display units PXG, and the blue display units PXB may be substantially arranged alternately in the first direction, but not limited thereto.

The defect P is in the panel 100 or on a surface of the panel 100, which means that the defect P may be between the first substrate 110 and the second substrate 120, or the defect P may be on the second substrate 120 (in particular, on the surface of the second substrate 120). In the present disclosure, the "defect P" generally refers to elements that should not be present in the electronic device 10 or elements that may reduce the display quality of the electronic device 10, such as foreign matter, particles, and pollutants. During the manufacturing process of the panel 100, it could be found through inspection that the defects P will cause, for example but not limited to black spots, bright spots, or dark spots on the electronic device, which will affect the display quality of the electronic device 10. FIG. 2 illustrates an embodiment in which a defect P is in the green display unit PXG as an example, but the disclosure is not limited thereto. For example, the defect P may be caused by dust or particles in the process environment falling in/on the panel 100. The panel 100 may include one, two or more defects P. The defects P may be located in the red display unit PXR, the blue display unit PXB, or between the red display unit PXR and the blue display unit PXB. In alternatively, the defects P may be located in the red display unit PXR, the blue display unit PXB, and between the red display unit PXR and the blue display unit PXB at the same time. However, the present disclosure is not limited thereto.

Figure 3:
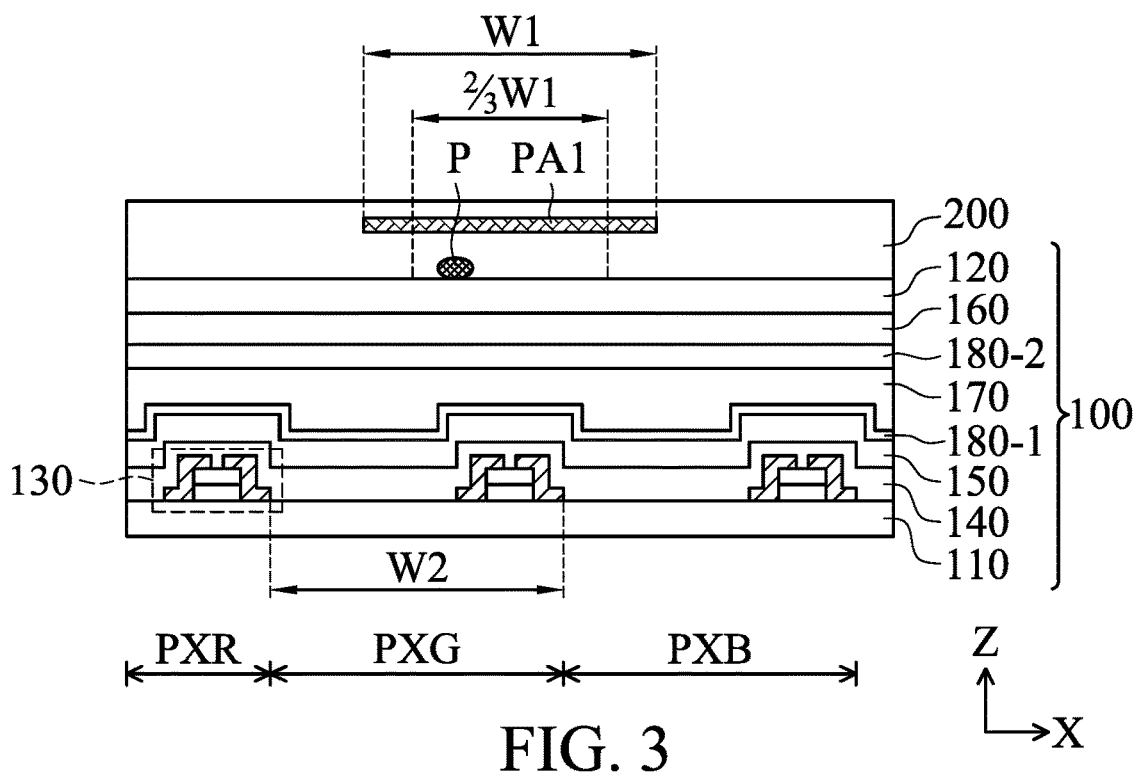
FIG. 3 illustrates a cross-sectional schematic view of an example of an electronic device of the present disclosure.

The first optical film 200 is disposed above the panel 100. In particular, the first optical film 200 is disposed on the panel 100 in a third direction (Z direction, a normal direction of the first substrate 110) and overlaps the defects P. The first optical film 200 has a first processed area PA1. FIG. 2 shows an embodiment in which the first processed area PA1 is rectangle as an example, but the disclosure is not limited thereto. The first processed area PA1 may have various shapes, including a square, a rectangle, a parallelogram, a polygon, and an irregular shape. The first optical film 200 may have a plurality of first processed areas PA1, and the first processed areas PA1 may have different shapes independently. A position of the first processed area PA1 corresponds to the position of the defect P. The term "corresponds" as used herein indicates at least partially overlapping or completely overlapping in the third direction (Z direction, the normal direction of the first substrate 110, which may also be referred to as the top view direction of the electronic device). For example, a part of the first element overlaps a part of the second element, the first element overlaps a part of the second element, or the first element overlaps the second element completely in the third direction (Z direction). That is, the first processed area PA1 at least partially overlaps the defect P in the third direction (Z direction). In some embodiments, the first processed area PA1 overlaps the entire defect P. In this embodiment, a projection of the defect P on the first substrate 110 is within a projection of the first processed area PA1 on the first substrate 110. In some embodiments, the size of the defect point P is less than or equal to ⅔ of the width of the first processed area PA1. That is, "the processed area corresponds to the defect" indicates that the projection of the defect P on the first substrate 110 is within ⅔ width of the projection of the first processed area PA1 on the first substrate 110. In this embodiment, one first processed area PA1 may correspond to a plurality of defects P, but the disclosure is not limited thereto. In some embodiments, a plurality of first processed areas PA1 may correspond to a plurality of defect points P. In some embodiments, the width of the first processed area PA1 in the first direction≥the width of the display unit in the first direction (i.e., the distance between two adjacent data lines 111). The first processed area PA1 corresponds to at least two of the display units PX, and the two display units may emit light of the same color or different colors. For example, as shown in FIG. 2 and FIG. 3, the first processed area PA1 at least partially overlaps the green display unit PXG and the blue display unit PXB. The first width W1 of the first processed area PA1≥a second width W2 of the green display unit PXG. In some embodiments, the first processed area PA1 at least partially overlaps at least two display units of the plurality of display units PX, and the color of the light of the two display units may be the same. It is possible to reduce the brightness of bright spots caused by the defects P in the electronic device by disposing the processed area corresponding to the defect P in the optical film. Therefore, the display quality of the electronic device could be improved.

Referring to FIG. 3, the defect P is on the second substrate 120 of the panel 100, and the first optical film 200 is formed on the panel 100 and overlaps the defect P. The first optical film 200 includes a first processed area PA1, and in the top view of the electronic device 10, the first processed area PA1 corresponds to the defect P. The panel 100 includes a first substrate 110, a plurality of thin film transistors 130 disposed on the first substrate 110, an insulating layer 140 disposed on the plurality of thin film transistors 130, an electrode layer 150 disposed on the insulating layer 140, an alignment layer 180-1 disposed on the electrode layer 150, a display medium layer 170 disposed on the alignment layer 180-1, an alignment layer 180-2 disposed on the display medium layer 170, a color filter layer 160 disposed on the alignment layer 180-2, and a second substrate 120 on the color filter layer 160. Although FIG. 3 shows an embodiment in which the defect P is on the second substrate 120 as an example, the disclosure is not limited thereto. In some embodiments, the defect P may be in the panel 100, including but not limited to in the display medium layer 170, in the electrode layer 150, and/or in the insulating layer 140. In particular, the electrode layer as used herein may include, for example, a metal or a metal oxide, but it is not limited thereto. The alignment layer may include, for example but not limited to a polyimide (PI). In addition, the insulating layer may be, for example but not limited to an organic insulating layer or an inorganic insulating layer.

Figure 4:
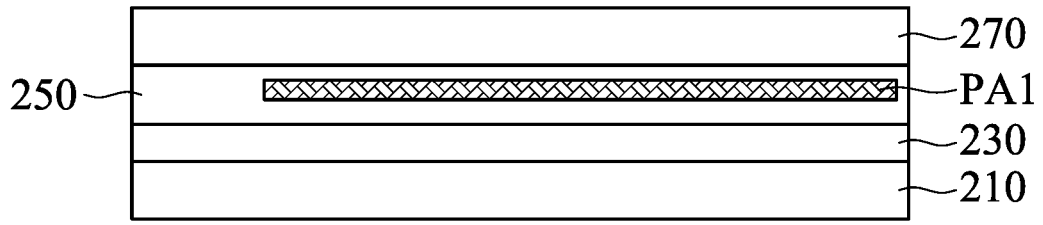
FIG. 4 illustrates an enlarged cross-sectional schematic view of an example of an optical film of the present disclosure.

The optical film of the present disclosure will be further described below with reference to FIG. 4. FIG. 4 illustrates an enlarged cross-sectional schematic view of an example of a first optical film 200 of the present disclosure. As shown in FIG. 4, the first optical film 200 includes a first base 210, a polarizing film 230 formed on the first base 210, a second base 250 formed on the polarizing film 230, and a protective layer 270 formed on the second base 250. The first optical film 200 may adhere to the second substrate 120 through the first base 210. In some embodiments, the protective layer 270 may be omitted. In some embodiments, the first base 210 may include one or more layers and the second base 250 may include one or more layers. For example, the first base 210 may include a transparent waterproof base layer, an optical compensation layer and/or an adhesive layer. The second base 250 may include a transparent waterproof base layer, a polymer layer (such as a View Angle Enhance (VAE) layer or an anti-glare layer). In some embodiments, the polymer layer may have a microstructure. FIG. 4 shows an embodiment in which the first processed area PA1 is in the second base 250 as an example, but the disclosure is not limited thereto. The first processed area PA1 may be in one or more layers above the polarizing film 230. The expression "the first processed area PA1 above the polarizing film 230" as used herein indicates that in the third direction, the vertical distance between the first processed area PA1 and the panel 100 is greater than the vertical distance between the polarizing film 230 and the panel 100. The optical film may include, for example but not limited to, vinyl acetate-ethylene copolymer, polyethylene terephthalate or other suitable materials.

Figure 5:
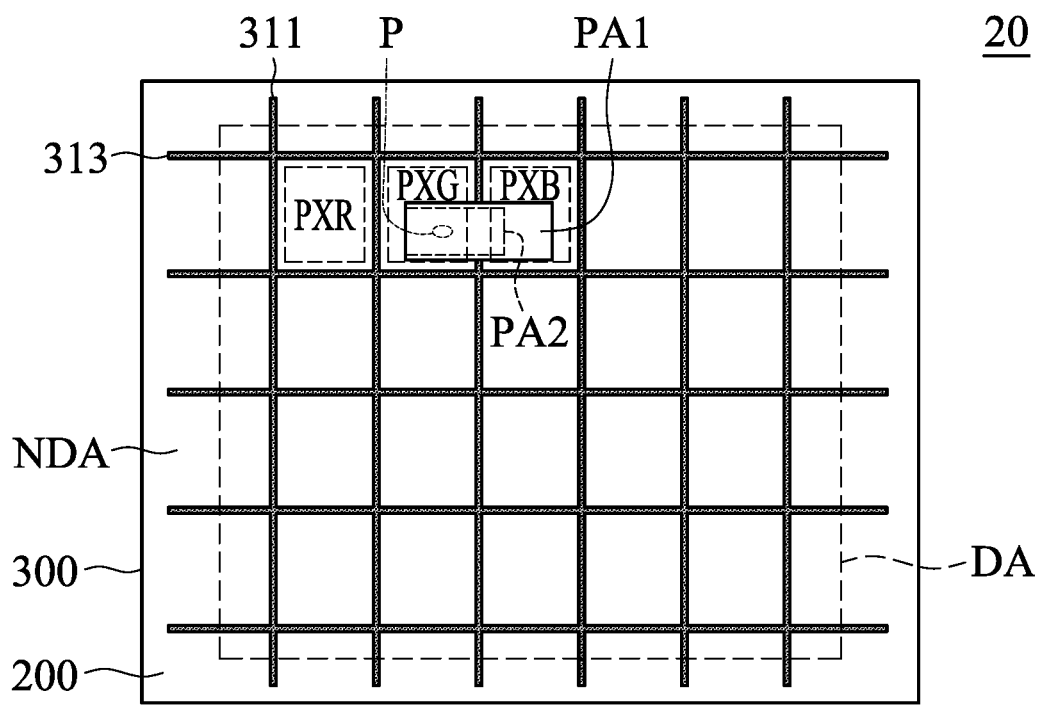
FIG. 5 illustrates a top view of another example of the electronic device of the present disclosure.

In some embodiments, the electronic device may further include a second processed area PA2 corresponding to the defect P and overlapping the entire defect P in the third direction, as shown in FIG. 5. FIG. 5 illustrates a top view of another example of the electronic device 20 of the present disclosure. FIG. 5 shows an embodiment in which the shapes of the first processed area PA1 and the second processed area PA2 are rectangles as an example, but the disclosure is not limited thereto. There are several possible shapes for the first processed area PA1 and the second processed area PA2, including square, rectangular, a parallelogram, a polygon, or an irregular shape. In the embodiment shown in FIG. 5, the first processed area PA1 and the second processed area PA2 correspond to the green display unit PXG and the blue display unit PXB, and they overlap a part of the green display unit PXG and the blue display unit PXB in the third direction, but the disclosure is not limited thereto. In some embodiments, the second processed area PA2 may be located in one display unit. In the embodiment shown in FIG. 5, the first processed area PA1 overlaps the entire second processed area PA2 in the third direction. A projection of the defect P on the first substrate 310 is within a projection of the second processed area PA2 on the first substrate 310. The projection of the second processed area PA2 on the first substrate 310 (see FIGS. 6 to 8) is within the projection of the first processed area PA1 on the first substrate 310, but the disclosure is not limited thereto. In some embodiments, one second processed area PA2 may correspond to a plurality of defects P, but the disclosure is not limited thereto. In some embodiments, a plurality of second processed areas PA2 may correspond to a plurality of defect points P. That is, "the second processed area corresponds to the defect" indicates that the projection of the defect P on the first substrate 310 is within ⅔ width of the projection of the second processed area PA2 on the first substrate 310. In some embodiments, the first processed area PA1 corresponds to the second processed area PA2 and partially overlaps the second processed area PA2 in the third direction. The second processed area PA2 may have a third width W3 in the first direction. The first width W1 of the first processed area PA1 is greater than the third width W3 of the second processed area PA2, as shown in FIGS. 6 to 8.

Figure 6:
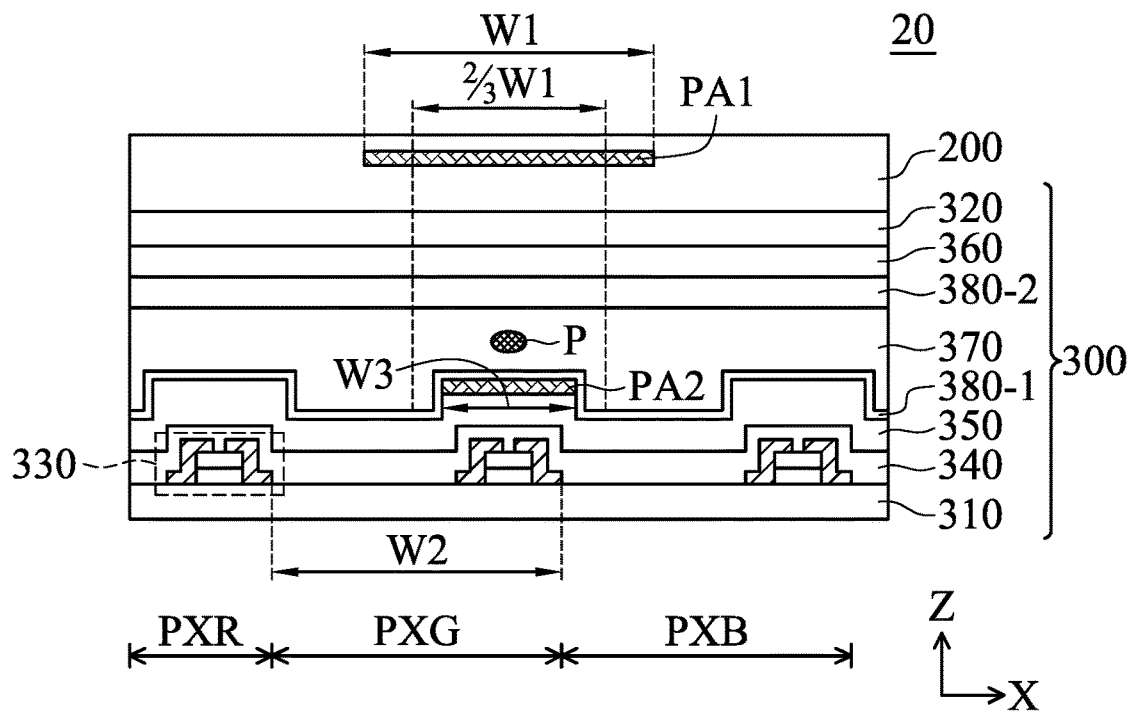
FIG. 6 illustrates a cross-sectional schematic view of an example of the electronic device shown in FIG. 5.

FIG. 6 illustrates a cross-sectional schematic view of an example of the electronic device 20 shown in FIG. 5. As shown in FIG. 6, the electronic device 20 includes a panel 300 and a first optical film 200 as shown in FIG. 4. The panel 300 includes a first substrate 310, a plurality of thin film transistors 330 disposed on the first substrate 310, an insulating layer 340 disposed on the plurality of thin film transistors 330, an electrode layer 350 including a second processed area PA2 disposed on the insulating layer 340, an alignment layer 380-1 disposed on the electrode layer 350, a display medium layer 370 disposed on the alignment layer 380-1, an alignment layer 380-2 disposed on the display medium layer 370, a color filter layer 360 disposed on the alignment layer 380-2, and a second substrate 320 on the color filter layer 360. The defect P is located in the display medium layer 370. The second processed area PA2 corresponds to the first processed area PA1 in the second base 250 of the first optical film 200 as shown in FIG. 4 and the defect P in the display medium layer 370.

Figure 7:
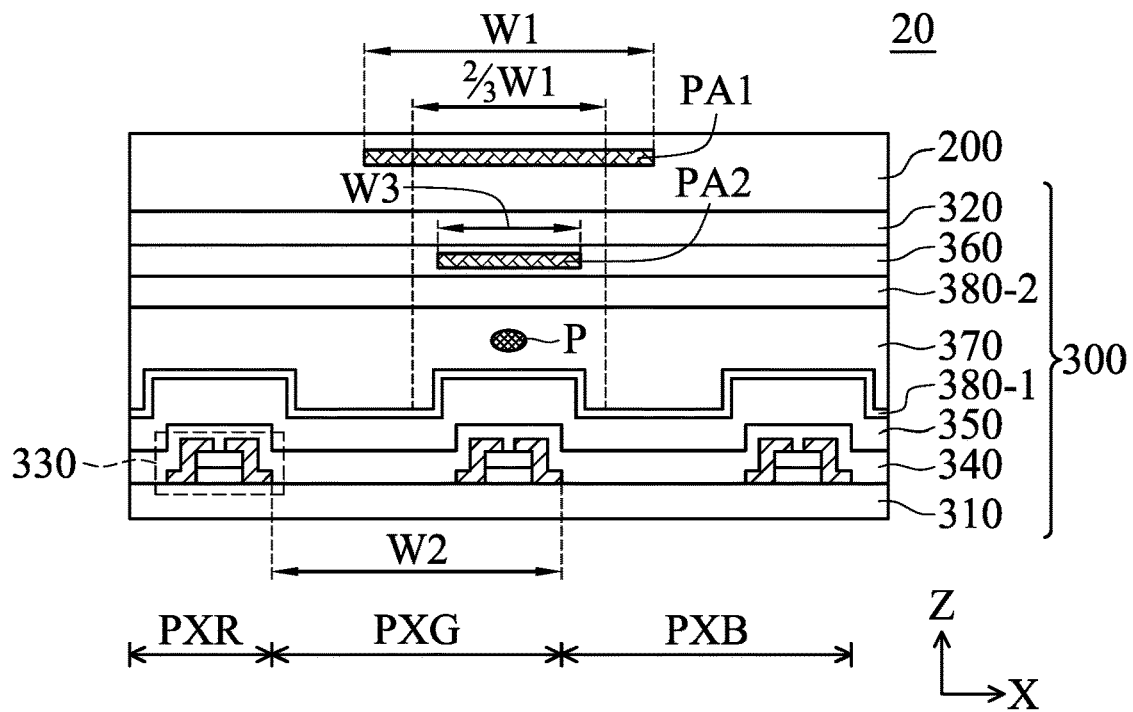
FIG. 7 illustrates a cross-sectional schematic view of another example of the electronic device shown in FIG. 5.

FIG. 7 illustrates a cross-sectional schematic view of another example of the electronic device 20 shown in FIG. 5. As shown in FIG. 7, the electronic device 20 includes a panel 300 and a first optical film 200 as shown in FIG. 4. The panel 300 includes a first substrate 310, a plurality of thin film transistors 330 disposed on the first substrate 310, an insulating layer 340 disposed on the plurality of thin film transistors 330, an electrode layer 350 disposed on the insulating layer 340, an alignment layer 380-1 disposed on the electrode layer 350, an display medium layer 370 disposed on the alignment layer 380-1, an alignment layer 380-2 disposed on the display medium layer 370, a color filter layer 360 including a second processed area PA2 disposed on the alignment layer 380-2, and a second substrate 320 on the color filter layer 360. The defect point P is located in the display medium layer 370. The second processed area PA2 corresponds to the first processed area PA1 in the second base 250 of the first optical film 200 as shown in FIG. 4 and the defect P in the display medium layer 370.

Figure 8:
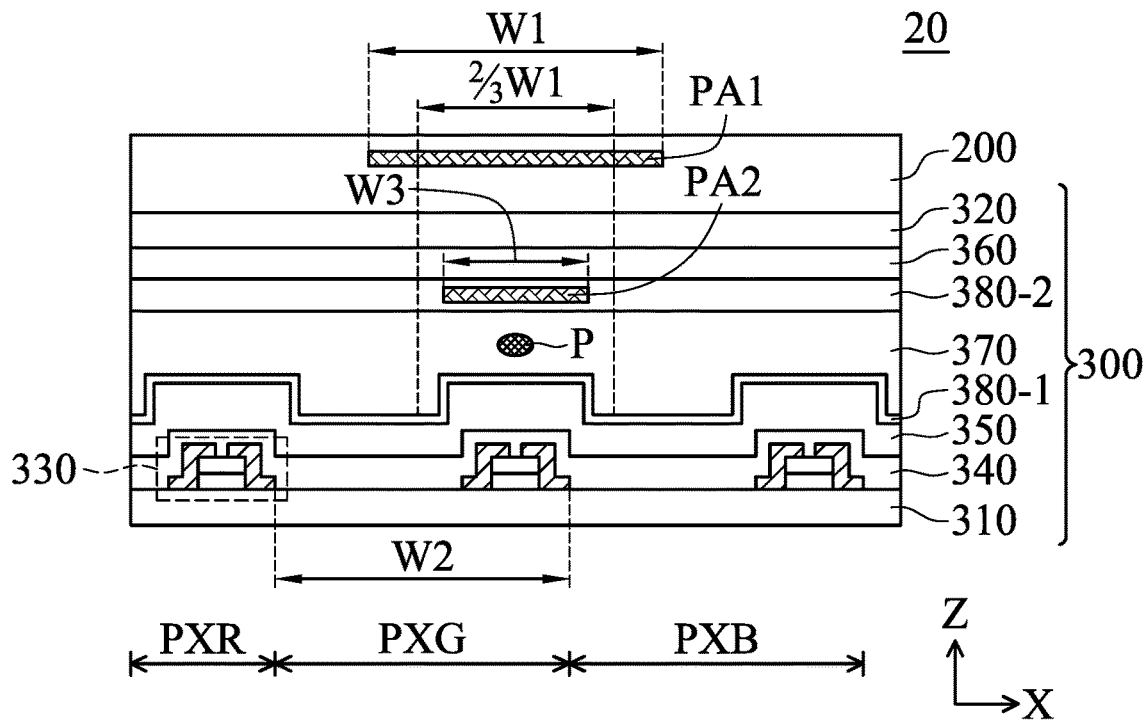
FIG. 8 illustrates a cross-sectional schematic view of a still another example of the electronic device shown in FIG. 5.

FIG. 8 illustrates a cross-sectional schematic view of a still another example of the electronic device 20 shown in FIG. 5. As shown in FIG. 8, the electronic device 20 includes a panel 300 and a first optical film 200 as shown in FIG. 4. The panel 300 includes a first substrate 310, a plurality of thin film transistors 330 disposed on the first substrate 310, an insulating layer 340 disposed on the plurality of thin film transistors 330, an electrode layer 350 disposed on the insulating layer 340, an alignment layer 380-1 disposed on the electrode layer 350, an display medium layer 370 disposed on the alignment layer 380-1, an alignment layer 380-2 including a second processed area PA2 disposed on the display medium layer 370, a color filter layer 360 disposed on the alignment layer 380-2, and a second substrate 320 on the color filter layer 360. The defect point P is located in the display medium layer 370. The second processed area PA2 corresponds to the first processed area PA1 in the second base 250 of the first optical film 200 as shown in FIG. 4 and the defect P in the display medium layer 370.

Figure 9:
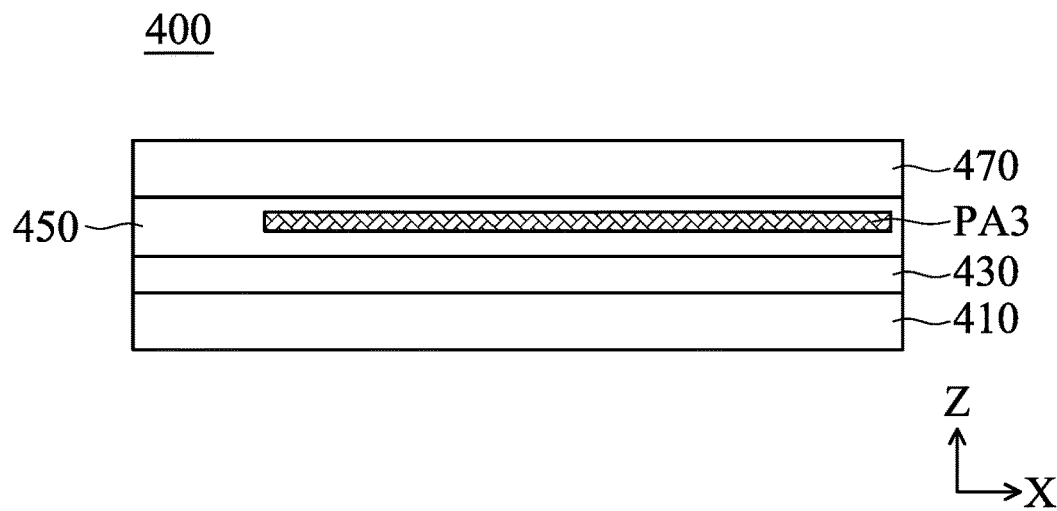
FIG. 9 illustrates an enlarged cross-sectional schematic view of an example of a second optical film of the present disclosure.

In some embodiments, the electronic device may further include a second optical film 400. The second optical film 400 may include a third processed area PA3 corresponding to the defect P and overlapping the entire defect P in the third direction. The second optical film 400 of the present disclosure will be further described below with reference to FIG. 9. FIG. 9 illustrates an enlarged cross-sectional schematic view of an example of a second optical film 400 of the present disclosure. As shown in FIG. 9, the second optical film 400 includes a first base 410, a polarizing film 430 formed on the first base 410, a second base 450 formed on the polarizing film 430, and a protective layer 470 formed on the second base 450. The second optical film 400 may adhere to the first substrate of the panel through the first base 410. In some embodiments, the protective layer 470 may be omitted. In some embodiments, the first base 410 may include one or more layers and the second base 450 may include one or more layers. For example, the first base 410 may include a transparent waterproof base layer, an optical compensation layer, and/or an adhesive layer. The second base 450 may include a transparent waterproof base layer, a polymer layer, and/or an anti-glare layer. FIG. 9 shows an embodiment in which the third processed area PA3 is in the second base 450 as an example, but the disclosure is not limited thereto. The third processed area PA3 may be located in one or more layers of the second base 450 above the polarizing film 430. The expression "the third processed area PA3 above the polarizing film 430" as used herein indicates that in the third direction, the vertical distance between the third processed area PA3 and the panel is greater than the vertical distance between the polarizing film 430 and the panel.

The structure of the second optical film 400 and the materials of each layer included in the second optical film 400 may be the same as or different from the first optical film 200. For example, in one embodiment, the first optical film 200 includes a first base 210, a polarizing film 230, a second base 250, and a protective layer 270. The second optical film 400 includes a first base 410 and a polarizing film 430 and a second base 450.

Figure 10:
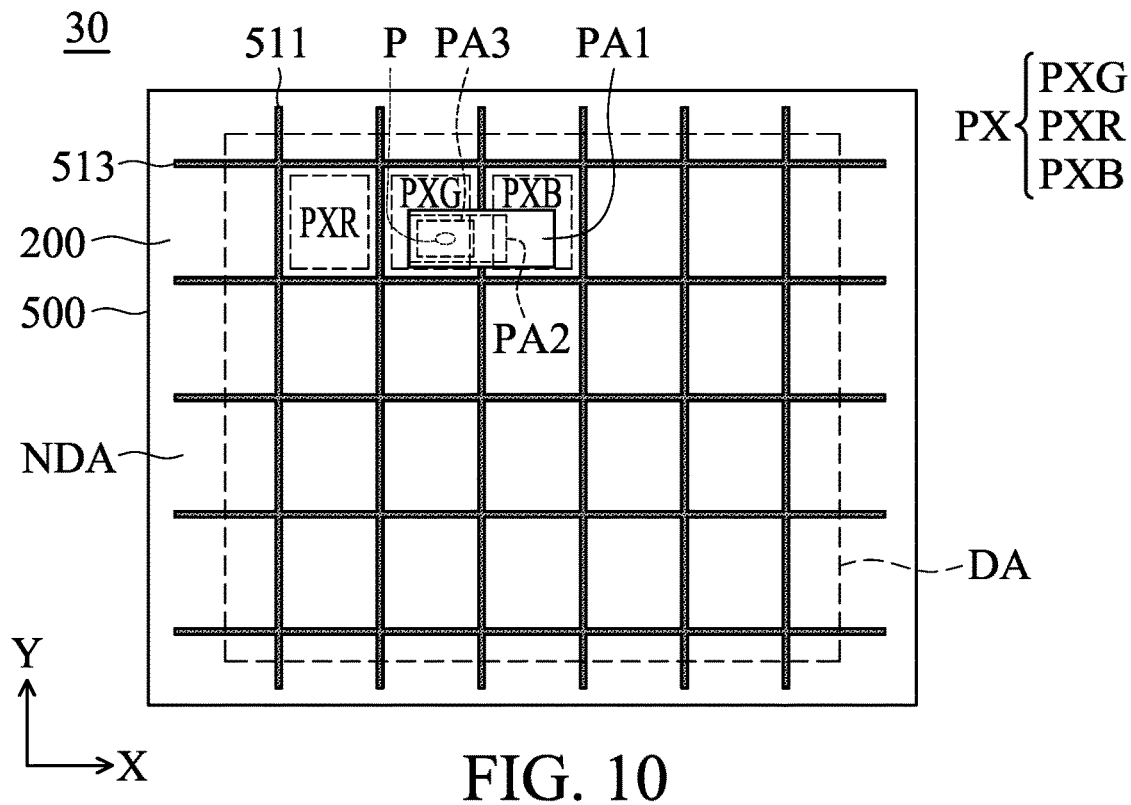
FIG. 10 illustrates a top view of another example of the electronic device of the present disclosure.
Figure 11:
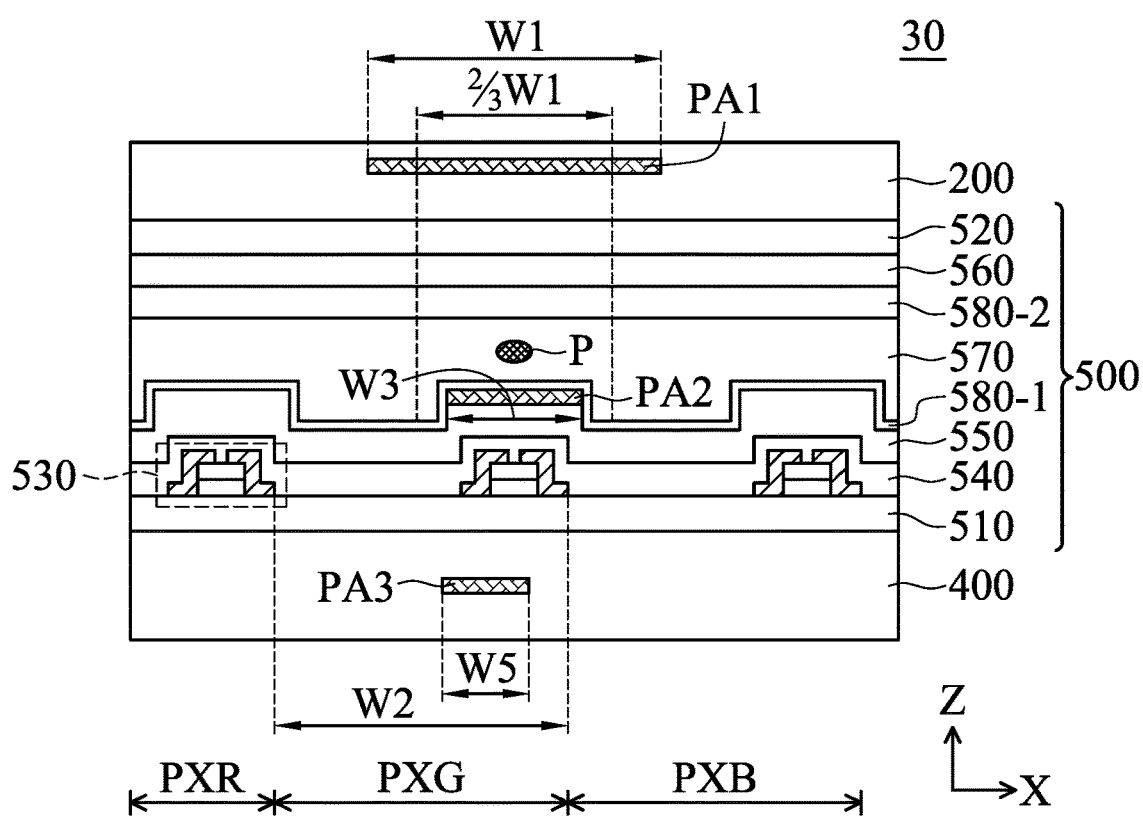
FIG. 11 illustrates a cross-sectional schematic view of an example of the electronic device shown in FIG. 10.
Figure 12:
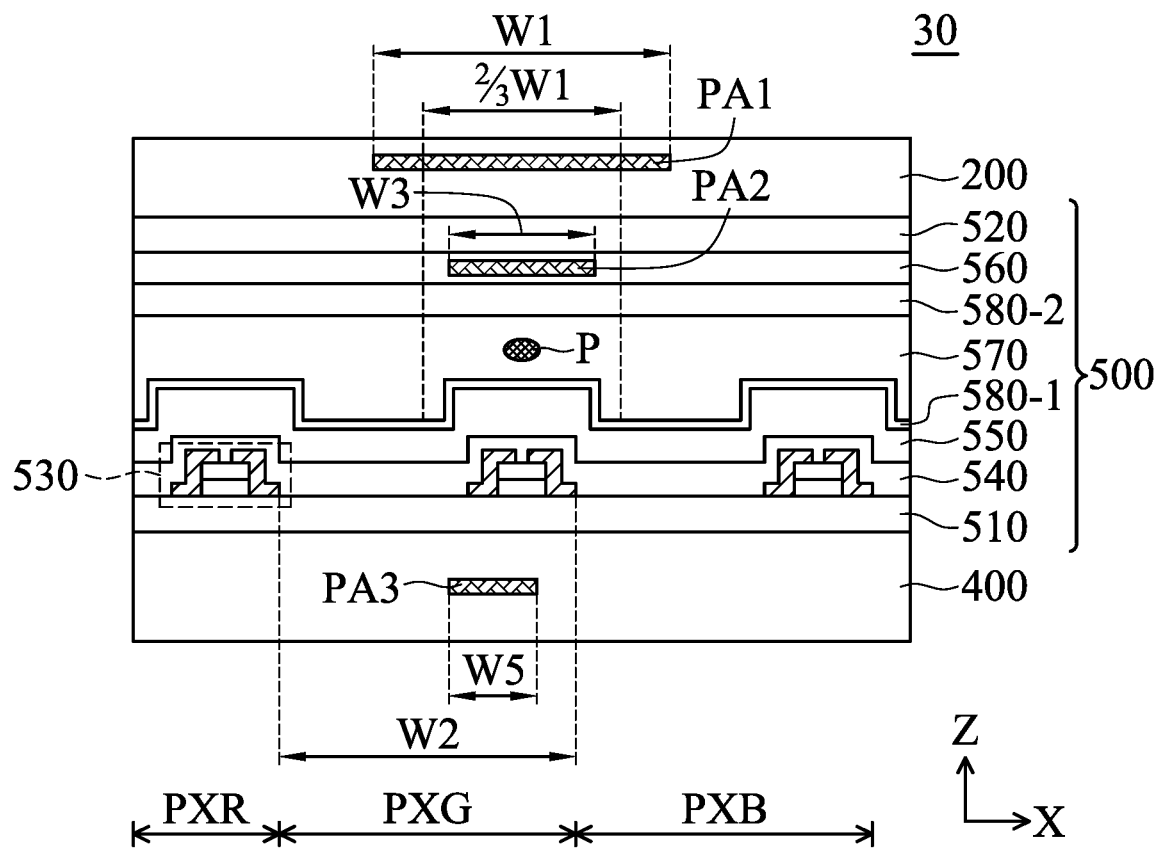
FIG. 12 illustrates a cross-sectional schematic view of an example of the electronic device shown in FIG. 10.

FIG. 10 illustrates a top view of another example of the electronic device 30 including the second optical film 400 of the present disclosure. FIG. 10 shows an embodiment in which the shapes of the first processed area PA1, the second processed area PA2, and the third processed area PA3 are all rectangles as an example, but the disclosure is not limited thereto. There are a number of possible shapes for the first processed area PA1, the second processed area PA2, and the third processed area PA3, including square, rectangular, a parallelogram, a polygon, or some irregular shape. In the embodiment shown in FIG. 10, the first processed area PA1 and the second processed area PA2 correspond to the green display unit PXG and the blue display unit PXB, and they overlap a part of the green display unit PXG and the blue display unit PXB in the third direction. The third processed area PA3 corresponds to the green display unit PXG, and it overlaps a part of the green display unit PXG in the third direction, but the disclosure is not limited thereto. In some embodiments, the second processed area PA2 may be located in one display unit, and the third processed area PA3 may correspond to two display units. In the embodiment shown in FIG. 10, the first processed area PA1 overlaps the entire second processed area PA2 in the third direction, and the second processed area PA2 overlaps the entire third processed area PA3 in the third direction. A projection of the defect P on the first substrate 510 is within a projection of the third processed area PA3 on the first substrate 510. The projection of the third processed area PA3 on the first substrate 510 is within the projection of the second processed area PA2 on the first substrate 510. The projection of the second processed area PA2 on the first substrate 510 (see FIGS. 11 and 12) is within the projection of the first processed area PA1 on the first substrate 510, but the disclosure is not limited thereto. In some embodiments, one third processed area PA3 may correspond to a plurality of defects P, but the disclosure is not limited thereto. In some embodiments, a plurality of third processed area PA3 may correspond to a plurality of defect points P. That is, "the third processed area corresponds to the defect" indicates that a projection of the defect P on the first substrate 510 is within ⅔ width of a projection of the third processed area PA3 on the first substrate 510. In some embodiments, the first processed area PA1 may partially overlap the second processed area PA2 in the third direction, the first processed area PA1 may partially overlap the third processed area PA3 in the third direction, and/or the second processed area PA2 may partially overlap the third processed area PA3 in the third direction. The third processed area PA3 may have a fifth width W5 in the first direction. The first width W1 of the first processed area PA1 is greater than the third width W3 of the second processed area PA2, and the third width W3 of the second processed area PA2 is greater than the fifth width W5 of the third processed area PA3 as shown in FIGS. 11 and 12, but it is not limited thereto. In some embodiments, the third width W3 of the second processed area PA2 is smaller than the fifth width W5 of the third processed area PA3.

FIG. 11 illustrates a cross-sectional schematic view of an example of the electronic device 30 shown in FIG. 10. As shown in FIG. 11, the electronic device 30 includes the first optical film 200 shown in FIG. 4, the second optical film 400 shown in FIG. 10, and a panel 500 between the first optical film 200 and the second optical film 400. The panel 500 includes a first substrate 510, a plurality of thin film transistors 530 disposed on the first substrate 510, an insulating layer 540 disposed on the plurality of thin film transistors 530, an electrode layer 550 including a second processed area PA2 disposed on the insulating layer 540, an alignment layer 580-1 disposed on the electrode layer 550, a display medium layer 570 disposed on the alignment layer 580-1, an alignment layer 580-2 disposed on the display medium layer 570, a color filter layer 560 disposed on the alignment layer 580-2 and a second substrate 520 on the color filter layer 560. The defect P is located in the display medium layer 570. The second processed area PA2 is in the electrode layer 550 and corresponds to the first processed area PA1 in the second base 250 of the first optical film 200 shown in FIG. 4, the third processed area PA3 in the second base 450 of the second optical film 400 shown in FIG. 9, and the defect P.

FIG. 12 illustrates a cross-sectional schematic view of an example of the electronic device 30 shown in FIG. 10. As shown in FIG. 12, the electronic device 30 includes the first optical film 200 shown in FIG. 4, the second optical film 400 shown in FIG. 10, and a panel 500 between the first optical film 200 and the second optical film 400. The panel 500 includes a first substrate 510, a plurality of thin film transistors 530 disposed on the first substrate 510, an insulating layer 540 disposed on the plurality of thin film transistors 530, an electrode layer 550 disposed on the insulating layer 540, an alignment layer 580-1 disposed on the electrode layer 550, a display medium layer 570 disposed on the alignment layer 580-1, an alignment layer 580-2 disposed on the display medium layer 570, a color filter layer 560 including a second processed area PA2 disposed on the alignment layer 580-2 and a second substrate 520 on the color filter layer 560. The defect P is located in the display medium layer 570. The second processed area PA2 is in the color filter layer 560 and corresponds to the first processed area PA1 in the second base 250 of the first optical film 200 shown in FIG. 4, the third processed area PA3 in the second base 450 of the second optical film 400 shown in FIG. 9, and the defect P.

Figure 13:
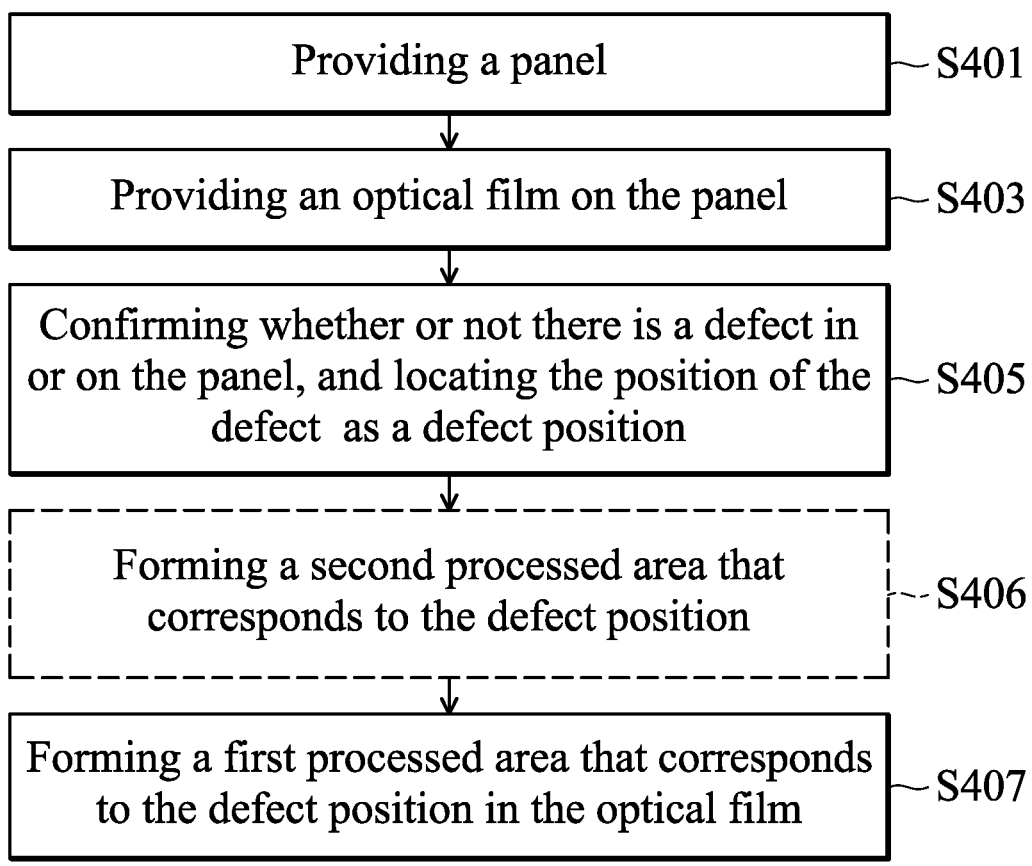
FIG. 13 illustrates a flow chart of an example of a method of forming an electronic device of the present disclosure.

The present disclosure also provides a method of forming an electronic device. FIG. 13 illustrates a flow chart of an example of method 40 of forming an electronic device of the present disclosure. As shown in FIG. 13, the method 40 of forming an electronic device of the present disclosure comprises the following steps. Step S401 provides a panel. Step S403 provides an optical film on the panel. Step S405 confirms whether there is a defect in or on the panel, and locates the defect's position. Step S407 forms a first processed area that corresponds to the position of the defect in the optical film.

Hereinafter, the method 40 for forming the electronic device of the present disclosure will be described with reference to FIGS. 14 to 17. FIGS. 14-17 are cross-sectional schematic views corresponding to each step of the forming method of an electronic device shown in FIG. 13.

Figure 14:
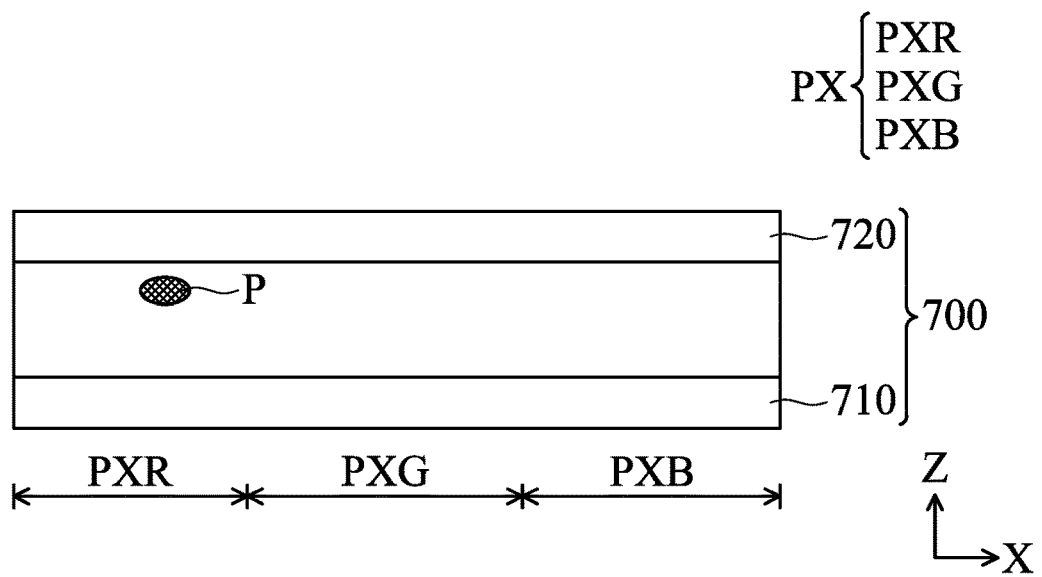
FIGS. 14-17 are cross-sectional schematic views corresponding to steps of the method of forming the electronic device shown in FIG. 13.

First, the panel 700 shown in FIG. 14 is provided in step S401. The panel 700 includes a plurality of display units PX, and the display units PX can be divided into red display units PXR, green display units PXG, and blue display units PXB according to the color of the emitted light. The panel 700 includes a first substrate 710 and a second substrate 720. FIG. 14 shows an embodiment in which the first substrate 710 is a thin film transistor substrate, the second substrate 720 is a color filter substrate, and the defect P is located between the first substrate 710 and the second substrate 720 as an example. In this embodiment, the distance between the second substrate 720 and the defect P is greater than the distance between the first substrate 710 and the defect P, but the disclosure is not limited thereto. FIG. 14 shows only one defect P as an example, but the disclosure is not limited thereto. In some embodiments, the panel provided in step S401 may be a panel without defects P. In some embodiments, the panel provided in step S401 may include a plurality of defects. The plurality of defects may be located at various positions of the panel 700. For example, the defect may be formed on the surface of the first substrate 710 and/or the second substrate 720 of the panel 700, in or between layers between the first substrate 710 and the second substrate 720.

Figure 15:
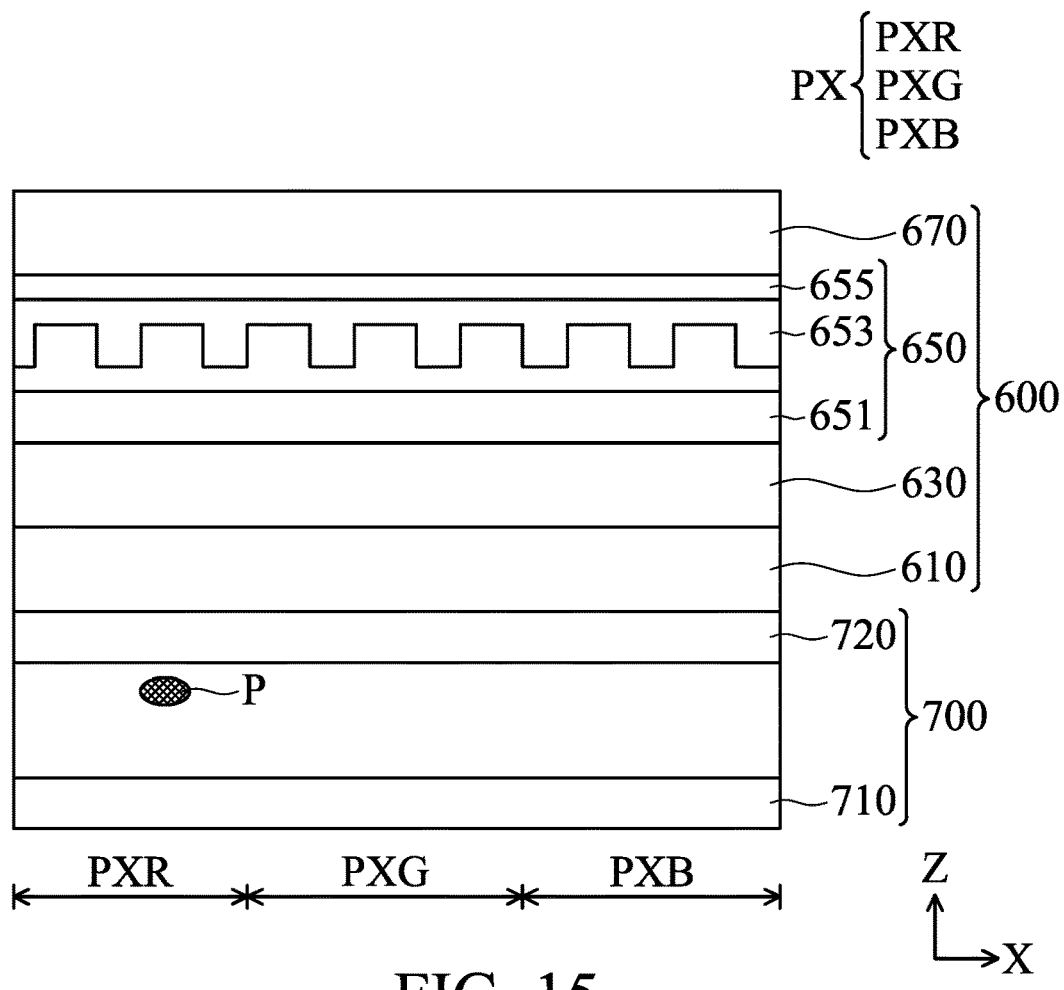

Next, in step S403, the optical film 600 is formed in a light emitting direction of the panel 700, as shown in FIG. 15. In some embodiments, the optical film 600 may be attached on the panel 700. The optical film 600 may have a multilayer structure. For example, as shown in FIG. 15, the optical film 600 may include a first base 610, a polarizing film 630 disposed on the first base 610, a second base 650 disposed on the polarizing film 630, and a protective layer 670 on the second base 650, but the disclosure is not limited thereto. In some embodiments, the protective layer 670 may be omitted. The first base 610 and the second base 650 may independently have a single-layer or multi-layer structure. In some embodiments, the first base 610 and the second base 650 may include a waterproof transparent substrate, so as to prevent the polarizing film from external moisture. In some embodiments, the first base 610 may be a multilayer structure including a transparent substrate and an adhesive layer. In this embodiment, the optical film 600 may adhere to the panel 700 through the adhesive layer. FIG. 15 shows that the second base 650 includes a transparent waterproof base layer 651, an anti-glare layer 655, and a polymer layer 653 disposed between the transparent waterproof base layer 651 and the anti-glare layer 655, wherein the polymer layer 653 has a microstructure as an example, but the present disclosure is not limited thereto. In some embodiments, the polymer layer 653 may not have a microstructure. In some embodiments, the anti-glare layer 655 may be omitted.

In step S405, the structure obtained in step S403 is inspected with an optical microscope (OM) and/or a scanning electron microscope (SEM) to find the defect P, and the position of the defect P is marked as the "defect position." The defect P as used herein may be a defect that was originally present in the panel, or it may be a defect caused by dust or other particles on the panel. Defects P will cause bright spots in the electronic device when the defect P is between the layers of the electronic device. Accordingly, the defect position may be located by finding an area within the electronic device that corresponds to the multi-layer stacked structure in which the defect P is present. It may be observed in the Z direction (the normal direction of the substrate) through the optical microscope that the brightness of the area where the defect P is present is brighter than other areas in the electronic device while the backlight module of the electronic device is turned on. The difference in brightness of light emitted by the electronic device could be inspected by, for example, the human eye, or a suitable instrument. However, the method of locating the defect position is not limited thereto.

Figure 16:
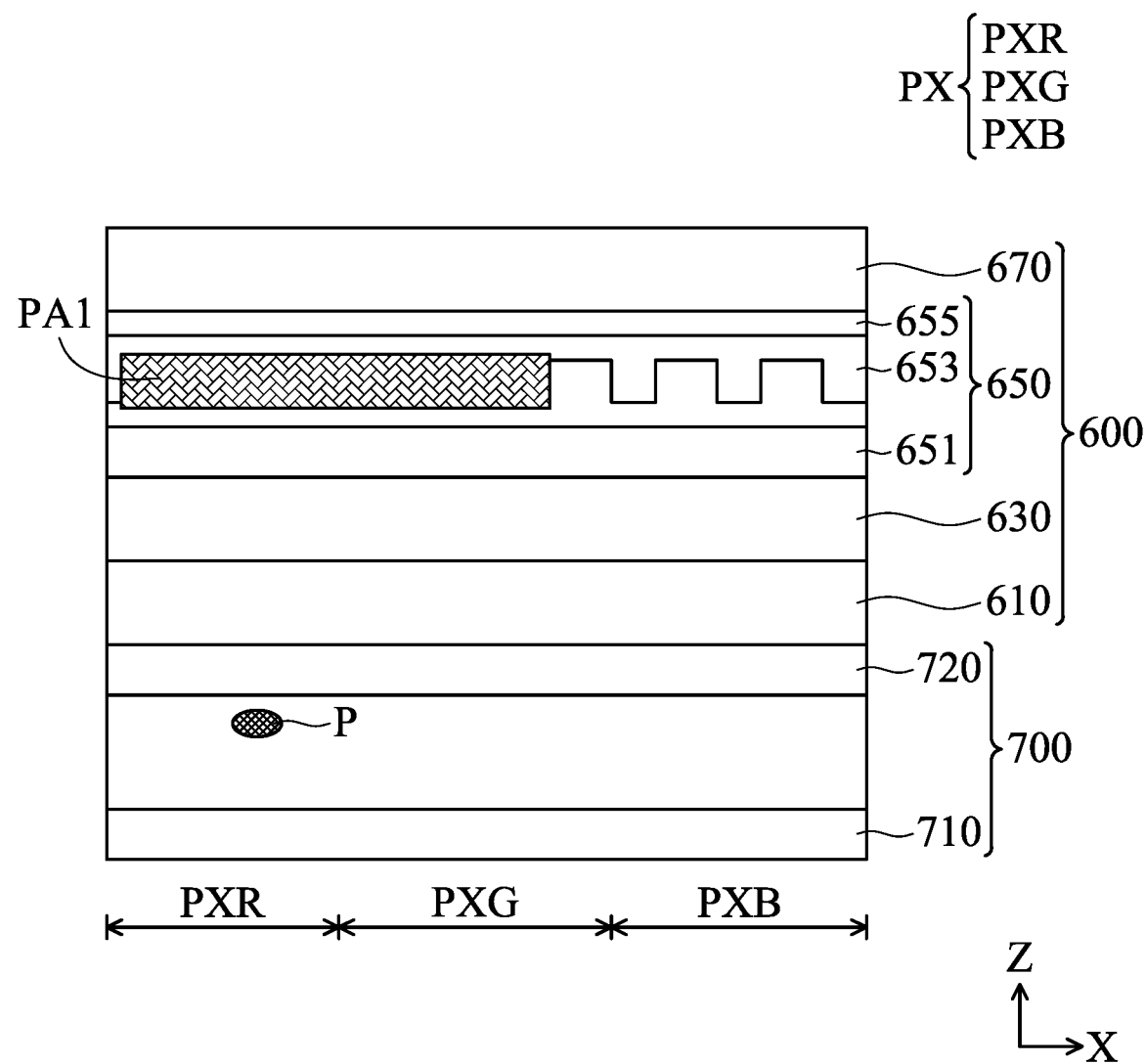

After the defect position is located, a first processed area PA1 is formed in the area of the optical film 600 that corresponds to the defect position using a frosting process in step S407. The resulting structure is shown in FIG. 16. The frosting process includes using nanosecond laser technology, picosecond laser technology, femtosecond laser technology, or a combination thereof. The first processed area PA1 corresponding to the defect P is formed by irradiating the area of the optical film 600 corresponding to the defect position with a nanosecond laser, a picosecond laser, a femtosecond laser, or a combination thereof. For example, the picosecond laser and the femtosecond laser could destroy and frost a target area without destroying a structure above the target area. The laser technology described in the present disclosure may use, for example but not limited to 355 nm, 533 nm, or 1064 nm laser light or a combination thereof. The frosting process of step S407 will be further described below with reference to FIG. 16. FIG. 16 illustrates an embodiment in which the first processed area PA1 is formed in the polymer layer 653 with a microstructure as an example, but the present disclosure is not limited thereto.

In some embodiments, the first processed area PA1 may be formed in the transparent waterproof base layer 651/or the anti-glare layer 655, as long as the vertical distance between the first processed area PA1 and the panel 700 is greater than the vertical distance between the polarizing film 630 and the panel 700. In this embodiment, a focus of the laser (for example, a 533 nm picosecond/femtosecond laser pulse, a 1064 nm picosecond/femtosecond laser pulse or a combination thereof) is adjusted to irradiate the area of the polymer layer 653 corresponding to the defect position. Thereby, the microstructure of the area is destroyed and the area is frosted to form the first processed area PA1. A light passing through the first processed area PA1 may be scattered non-uniformly because the microstructure of the polymer layer 653 has been destroyed. Part of the light passing through the first processed area PA1 can be absorbed by the first processed area PA1 because the microstructure of the polymer layer 653 has been frosted. That is, the continuous microstructure of the polymer layer 653 is destroyed by frosting the area corresponding to the defect P with the frosting process. Therefore, the light reflected by the defect P will be scattered while passing through the processing area PA1. Accordingly, by forming the first processed area PA1 corresponding to the defect P, the brightness of the bright spot caused by the defect P could be reduced. The first processed area PA1 may have various shapes, including a square, a rectangle, a parallelogram, a polygon, and an irregular shape. In general, considering the traveling direction and scattering characteristics of light, the width of the first processed area PA1 in the first direction (X direction) needs to be greater than or equal to the width of at least one display unit in the first direction to ensure that the defect P is fully covered. In some embodiments, the size of the defect P is less than or equal to ⅔ of the width of the first processed area PA1. Therefore, one first processed area PA1 may correspond to one or more defects.

In some embodiments, the first processed area PA1 corresponds to two adjacent display units that emit lights with different colors. In some embodiments, the first processed area PA1 at least partially overlaps the at least two display units, wherein the light emitted by the at least two display units has the same or different colors.

Figure 17:
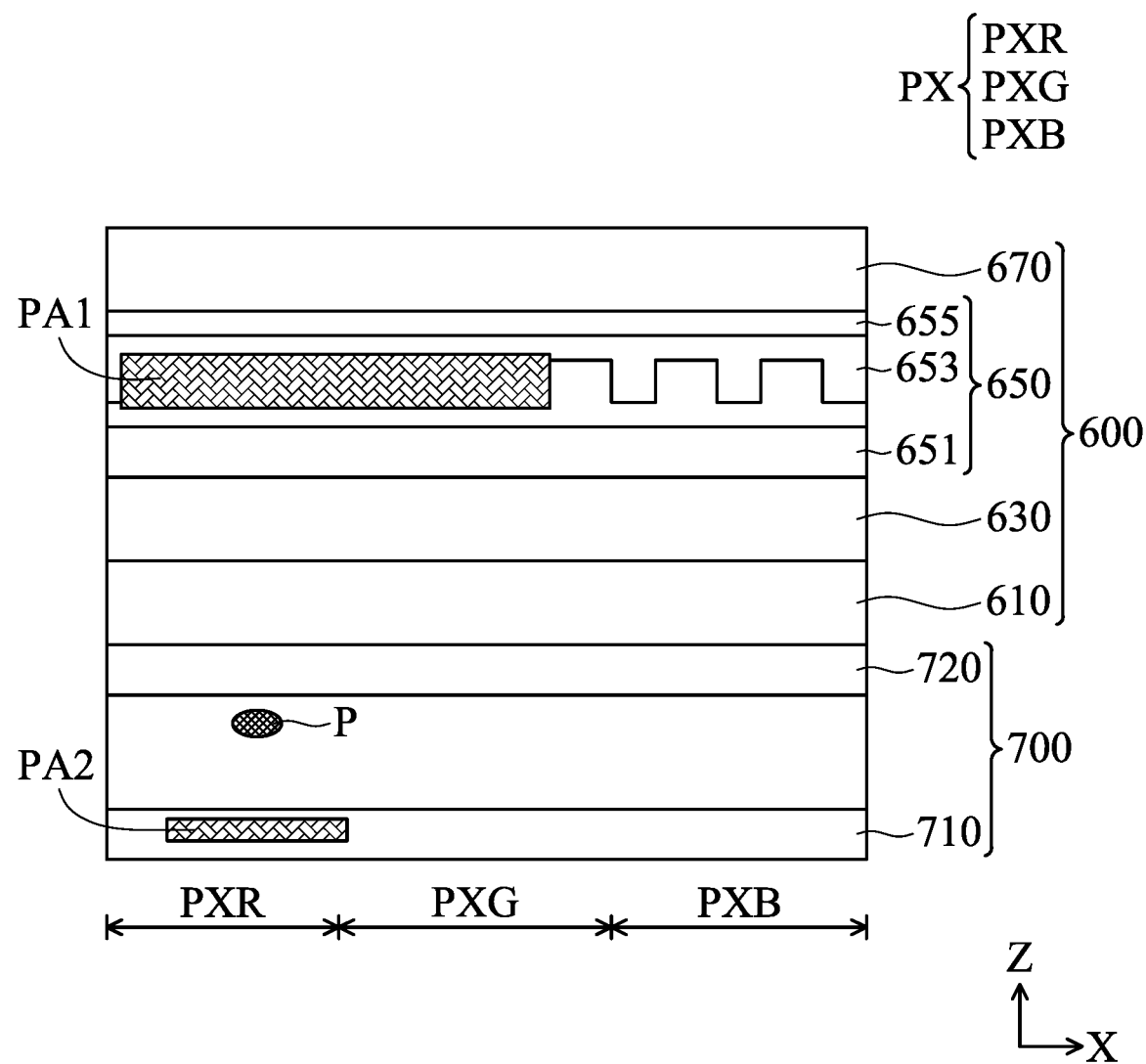

In some embodiments, the method 40 of forming an electronic device may further include a step S406 for forming a second processed area PA2 in the panel corresponding to the defect position before step S407. The second processed area PA2 is formed by a carbonization process. The carbonization process includes irradiating the panel with nanosecond laser, picosecond laser, femtosecond laser, or a combination thereof to form the second processed area PA2. For example, the picosecond laser and femtosecond laser technology used in the carbonization process can destroy and carbonize the target area without destroying a structure above the target area. The carbonization process of step S406 will be further described below with reference to FIG. 17. Although FIG. 17 shows an embodiment in which the second processed area PA2 is formed in the first substrate 710 (the color filter layer substrate of this embodiment) as an example, the present disclosure is not limited thereto. In some embodiments, the second processed area PA2 may be formed in the second substrate 720 (the thin film transistor substrate of this embodiment). In this embodiment, after locating the defect position, a focus of the laser (for example, a 533 nm picosecond/femtosecond laser pulse, a 1064 nm picosecond/femtosecond laser pulse or a combination thereof) is adjusted to irradiate an area of the first substrate 710 corresponding to the defect position. Thereby, the area is carbonized to form the second processed area PA2. In one embodiment, after the second processed area PA2 is formed, the focus of the laser pulse could be adjusted to form the first processed area PA1 corresponding to the second processed area PA2 in step S407.

Similar to the first processed area PA1, the second processed area PA2 may have various shapes, including squares, rectangles, parallelograms, polygons, and irregular shapes. In general, considering the traveling direction and scattering characteristics of light, the width of the first processed area PA1 (farther from the defect P than the second processed area PA2) in the first direction needs to be greater than or equal to the second processed area PA2 (closer to the defect P than the first processed area PA1) in the first direction to ensure that the defect P is fully covered. The brightness of the bright spot caused by the defect P could be reduced, but is not limited thereto. Similar to the first processed area PA1, one second processed area PA2 may correspond to one or more defects.

In some embodiments, the carbon content of the layer comprising the first processed area PA1 (for example, the polymer layer 653) may be lower than that of the layer comprising the second processed area PA2 (for example, the electrode layer in the first substrate 710 or the color filter layer or the alignment layer in the second substrate 720). In some embodiments, when the first processed area PA1 is in the optical film, the area of the upper surface of the optical film corresponding to the first processed area PA1 may have a protruding structure. Therefore, when the optical film has a protective layer 670 as the outermost layer, the area of an upper surface of the protective layer 670 corresponding to the first processed area PA1 may have a protruding structure due to the first processed area PA1 of the optical film, but it is not limited thereto. The "outermost layer" as used herein indicates a layer which is farthest away from the panel.

In some embodiments, before step S405, the method 40 of forming an electronic device may further include forming a second optical film on the panel. Therefore, the panel 700 is disposed between the optical film 600 and the second optical film. The second optical film may have a structure similar to that of the optical film 600. In this embodiment, the second optical film may include a polarizing film and a third processed area. The third processed area can be formed in the second optical film by the same process as forming the first processed area PA1 after step S405. Therefore, a light transmittance of the third processed area may be the same as that of the first processed area PA1. The light transmittance of the third processed area may be greater than a light transmittance of the second processed area PA2. The third processed area may be formed before the second processed area PA2 or after the first processed area PA1. Similar to the first processed area PA1, the vertical distance between the third processed area in the second optical film and the panel 700 is greater than the vertical distance between the polarizing film in the second optical film and the panel 700. The brightness of the bright spot caused by the defect P can be further reduced by forming the third processed area.

The present disclosure provides a method for forming an electronic device that reduces the brightness of the bright spot caused by the defect P. By reducing the brightness of the bright spots caused by the defect P, the defective panel can be repaired. Therefore, the display quality of the electronic device including the defective panel could be improved. In summary, the method provided by the present disclosure can reduce the manufacturing cost of the electronic device by processing the defective panel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. The features between the embodiments can be combined arbitrarily as long as they do not depart from or conflict with the spirit and scope of the present disclosure. In addition, each claim of the present disclosure may be an individual embodiment, and the scope of the present disclosure includes each claim of the present disclosure and any combinations of the embodiments.

While the disclosure has been disclosed by several preferred embodiments, the disclosure is not limited to the disclosed embodiments. Those skilled in the art may make various substitutions and alterations herein without departing from the spirit and scope of the present disclosure, and the different embodiments may be mixed to use, which is not limited herein. Therefore, the scope of protection of the present disclosure is defined as the subject matter set forth in the appended claims.

What is claimed is:

1. A method of forming an electronic device, comprising:
providing an assembly, wherein the assembly comprises a substrate, an optical film, a plurality of color filters and a defect, wherein the plurality of color filters and the defect are disposed between the substrate and the optical film; and
using a laser pulse to form a first processed area in the optical film, wherein the first processed area corresponds to the defect and at least partially overlaps at least two of the plurality of color filters,
wherein at least one of the at least two of the plurality of color filters has a second processed area corresponding to the first processed area, the first processed area has a first width in a first direction, the second processed area has a third width in the first direction, and the first width is greater than or equal to the third width.

2. The method as claimed in claim 1, wherein one of the at least two of the plurality of color filters has a second width in the first direction, and the first width is greater than or equal to the second width.

3. The method as claimed in claim 1, wherein the assembly further comprises a plurality of transistors disposed between the substrate and the plurality of color filters.

4. The method as claimed in claim 1, wherein the optical film comprises a polarizing film.

5. The method as claimed in claim 1, further comprising locating a position of the defect before using the laser pulse to form the first processed area.

6. The method as claimed in claim 1, wherein the optical film comprises a first layer, a second layer, and a third layer, wherein the second layer is between the first layer and the third layer, and the first processed area is in the second layer.

7. The method as claimed in claim 6, wherein the third layer is further from the substrate than the first layer.

8. The method as claimed in claim 6, wherein the second layer has a microstructure.

9. A method of forming an electronic device, comprising:
providing an assembly, wherein the assembly comprises a substrate, an optical film, a plurality of color filters and a defect, wherein the plurality of color filters and the defect are disposed between the substrate and the optical film; and
using a laser pulse to form a first processed area in the optical film, wherein the first processed area corresponds to the defect and at least partially overlaps at least two of the plurality of color filters,
wherein the assembly further comprises an electrode layer disposed between the substrate and the plurality of color filters, the electrode layer has a second processed area corresponding to the first processed area, the first processed area has a first width in a first direction, the second processed area has a third width in the first direction, and the first width is greater than or equal to the third width.

10. The method as claimed in claim 9, wherein the assembly further comprises a plurality of transistors disposed between the substrate and the plurality of color filters.

11. The method as claimed in claim 9, wherein the optical film comprises a polarizing film.

12. The method as claimed in claim 9, further comprising locating a position of the defect before using the laser pulse to form the first processed area.

13. The method as claimed in claim 9, wherein the optical film comprises a first layer, a second layer, and a third layer, wherein the second layer is between the first layer and the third layer, and the first processed area is in the second layer.

14. The method as claimed in claim 13, wherein the third layer is further from the substrate than the first layer.

15. The method as claimed in claim 13, wherein the second layer has a microstructure and the microstructure is destroyed to form the first processed area.

16. A method of forming an electronic device, comprising:
providing an assembly, wherein the assembly comprises a substrate, an optical film, a plurality of color filters and a defect, wherein the plurality of color filters and the defect are disposed between the substrate and the optical film; and
using a laser pulse to form a first processed area in the optical film, wherein the first processed area is corresponding to the defect and at least partially overlaps at least two of the plurality of color filters,
wherein the optical film comprises a first layer, a second layer, and a third layer, the second layer is between the first layer and the third layer and has a microstructure, the first processed area is in the second layer, and the microstructure is destroyed to form the first processed area.

* * * * *